(12) United States Patent
Sutardja (10) Patent No.: US 7,042,301 B2
(45) Date of Patent: May 9, 2006

(54) CRYSTAL OSCILLATOR EMULATOR

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 352 days.

(21) Appl. No.: 10/272,247

(22) Filed: Oct. 15, 2002

(65) Prior Publication Data

US 2004/0071029 A1    Apr. 15, 2004

(51) Int. Cl.
    *H03L 1/00*    (2006.01)
(52) U.S. Cl. .................... 331/176; 331/158; 331/66
(58) Field of Classification Search ............. 331/1 A, 331/175, 176, 185, 25, 74, 66, 158
    See application file for complete search history.

(56) References Cited

U.S. PATENT DOCUMENTS

| 4,893,097 | A |  | 1/1990 | Zwack | 331/66 X |
|---|---|---|---|---|---|
| 5,081,431 | A |  | 1/1992 | Kubo et al. | 331/158 |
| 5,574,408 | A | * | 11/1996 | Zwack | 331/176 |
| 5,659,270 | A |  | 8/1997 | Millen et al. | 331/69 |
| 5,809,336 | A |  | 9/1998 | Moore et al. |  |
| 6,598,148 | B1 |  | 7/2003 | Moore et al. |  |
| 6,803,829 | B1 |  | 10/2004 | Duncan et al. |  |
| 6,850,125 | B1 | * | 2/2005 | Norman et al. | 331/65 |
| 2004/0071029 | A1 |  | 4/2004 | Sutardja |  |

FOREIGN PATENT DOCUMENTS

| EP | 0766376 A1 | 2/1997 |
|---|---|---|
| EP | 01411630 A1 | 2/1997 |

OTHER PUBLICATIONS

Communication Pursuant to Article 96(2) EPC, for European Patent Application No. 03017477.5.

* cited by examiner

*Primary Examiner*—Arnold Kinkead (57) ABSTRACT

A device for generating an output signal having a frequency. The device having a die temperature and including a first temperature sensor to sense a first temperature. A non-volatile memory to store calibration information for controlling the output signal frequency as a function of the first temperature. A semiconductor oscillator to generate the output signal as a function of the calibration information.

66 Claims, 6 Drawing Sheets

CRYSTAL OSCILLATOR EMULATOR

TECHNICAL FIELD

This invention relates to voltage controlled oscillators (VCOs).

BACKGROUND

Precision frequency references are required in many types of electronic devices such as cellular phones and other handheld devices. Crystal oscillators are typically used to provide the precision frequency reference in these electronic devices. However, crystal oscillators have several inherent disadvantages including large bulky size, fragility, and high cost. In addition, the size and cost of crystal oscillators is related to the resonant frequency so that as the frequency increases, the size decreases, and the cost and fragility may rapidly increase. As the size of electronic devices continues to decrease, the use of crystal oscillators becomes more problematic due to the size, fragility, and cost limitations.

Semiconductor oscillators have been a poor alternative to crystal oscillators and are generally unsuitable for use as a precision frequency reference due to excessive variation in the oscillating frequency, especially with changes in temperature.

SUMMARY

A device for generating an output signal having a frequency. The device having a die temperature and including a first temperature sensor to sense a first temperature. A non-volatile memory to store calibration information for controlling the output signal frequency as a function of the first temperature. A semiconductor oscillator to generate the output signal as a function of the calibration information.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
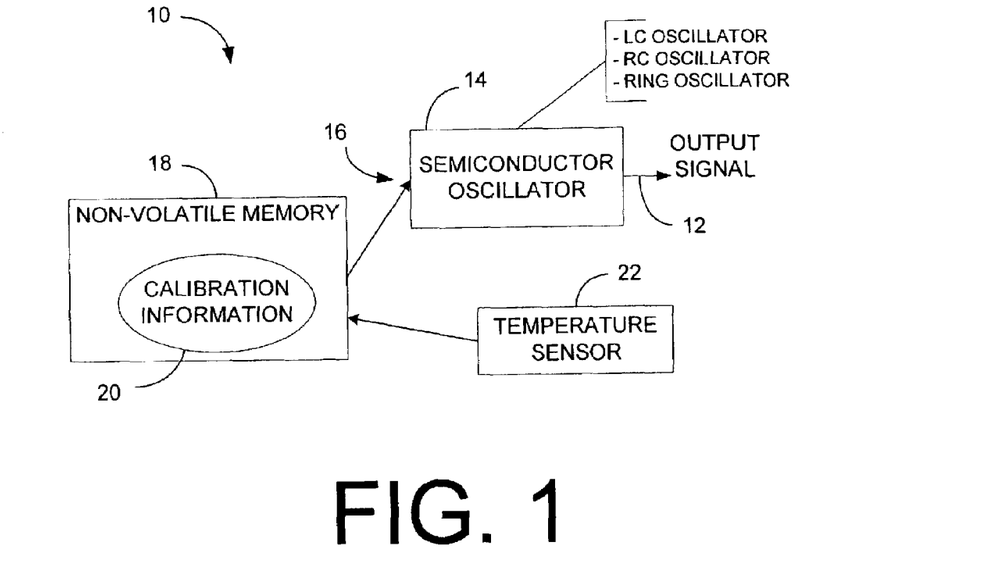
FIG. 1 is a block diagram showing an aspect of a crystal oscillator emulator.

FIG. 1 shows an aspect of a crystal oscillator emulator 10 for generating an output signal 12 having a precise frequency. The crystal oscillator emulator 10 may be constructed on a single semiconductor die using any process including a Complementary-Metal-Oxide-Semiconductor (CMOS) process.

The crystal oscillator emulator 10 may include a semiconductor oscillator 14 to generate the output signal 12. Any type of semiconductor oscillator may be used including LC oscillators, RC oscillators, and ring oscillators. The semiconductor oscillator 12 includes a control input 16 to vary the frequency of the output signal. The control input 16 may be any electrical input that effects a controlled change in the output signal frequency such as the supply voltage of a ring oscillator and a voltage input to a varactor of an LC oscillator.

A non-volatile memory 18 includes calibration information 20 for controlling the output signal frequency as a function of temperature. Any type of non-volatile memory may be employed including content addressable memory (CAM). The calibration information 20 may include a correction factor to be applied to the control input 16 of the semiconductor oscillator 14 to control the output signal frequency. The calibration information 20 may be a function of a change in temperature from a calibration temperature to an operating temperature, as well as being a function of absolute temperature.

A temperature sensor 22 may sense the temperature of the semiconductor die. Preferably, the temperature sensor is located on the semiconductor die in the vicinity of the semiconductor oscillator 14. Any type of temperature sensor 22 may be used including thermistors and infrared detectors. The temperature sensor 22 may be configured to measure a change in temperature from a baseline temperature or the present temperature.

Figure 2:
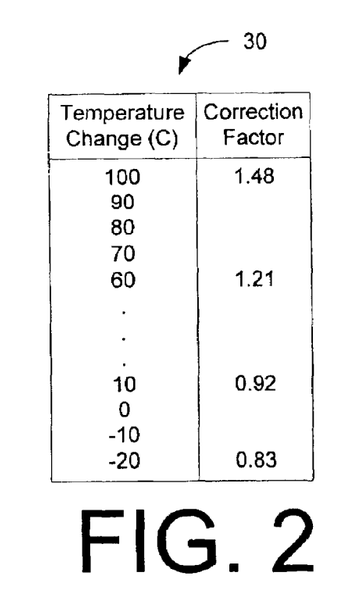
FIG. 2 is a table showing a relationship between temperature and correction factor.

FIG. 2 shows a storage technique 30 for storing the calibration information 20 in the non-volatile memory 18. The storage technique 30 may be any form of database including CAM, indexing schemes, look-up tables, and hash tables.

Figure 3:
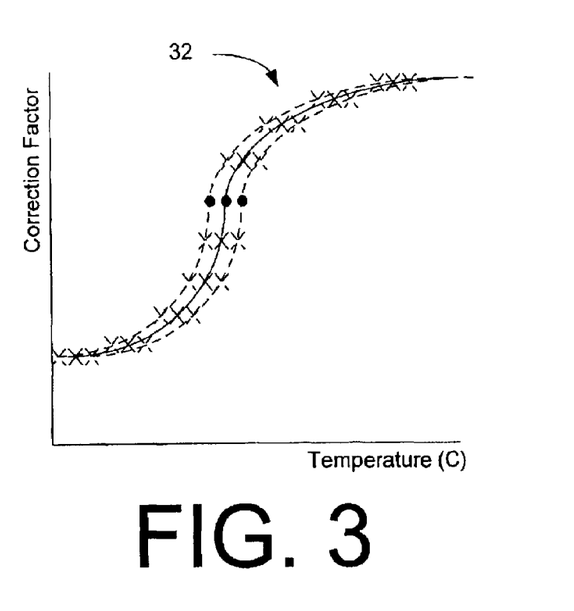
FIG. 3 is a graph showing a relationship between temperature and correction factor.

FIG. 3 shows a series of exemplary graphs 32 of correction factor values versus temperature for maintaining a constant output signal frequency for the crystal oscillator emulator 10. The data for constructing the curve may be attained in any manner including device-level testing and batch-mode testing.

Exemplary device-level testing may include testing each device to determine correction factors to be applied to the semiconductor oscillator to maintain a constant output frequency with changes in temperature. In one scheme, a baseline value for the semiconductor oscillator control input is determined for a predetermined frequency and at a predetermined temperature of the semiconductor die of the device such as the lowest operating temperature. The baseline value may be measured directly or interpolated from measurement of another device characteristic. Baseline values may also be measured for each potential output frequency. Also, baseline values for each potential output frequency may be extrapolated from the baseline value for the predetermined frequency such as by using a known circuit relationship. The baseline values for each potential output frequency may be stored as absolute values or as a ratio, a frequency factor, to compute the baseline values from a single baseline value.

The temperature of the semiconductor die is then increased from about the lowest operating temperature to about the maximum operating temperature in discrete steps. The number of discrete steps is preferably limited to about six temperature levels to reduce testing costs, but any number of discrete steps may be used. Preferably, an on-chip heater is used to heat the semiconductor die, but any means of varying the temperature of the semiconductor die may be employed. At each discrete step, the semiconductor die temperature and the correction factor for maintaining the output at a constant frequency may be measured.

The correction factor is preferably a ratio to be applied to the baseline value to obtain an adjusted value for the control input. The calibration factor may range from any baseline value such as 1. Preferably, a single correction factor is computed for each temperature step, to be applied to the semiconductor oscillator to maintain the output signal at any one of a multitude of predetermined frequencies. For example, if a correction factor of 1.218 is determined to correspond to a change in temperature of 45 C, then the control input of the semiconductor oscillator may be adjusted as a function of the correction factor such as by changing the control input in proportion to the correction factor. In another alternative, the correction factor may be applied to the baseline value corresponding to the desired output frequency to generate a calibrated value to which the control input is adjusted. In another alternative, correction factors may be measured corresponding to each of several output frequencies at each temperature step.

Batch-mode testing of crystal oscillator emulators 10 to obtain calibration information 20 may advantageously decrease costs by reducing the number of measurements for a batch of semiconductor dies. In batch-mode testing, the testing results for a subset of crystal oscillator emulators 10 from the same batch of semiconductor dies may be used for all of the devices in the batch. The subset of crystal oscillator emulators that are tested may range from one to any proportion of the total quantity of devices. For example, a single crystal oscillator emulator 10 may be tested and the resulting batch calibration information stored in each of the devices in the batch. In addition, each of the crystal oscillator emulators 10 may be tested for a subset of calibration information such as the output frequency at a baseline temperature. The subset of device specific calibration information may be used to modify the batch calibration information stored in each device.

Figure 4:
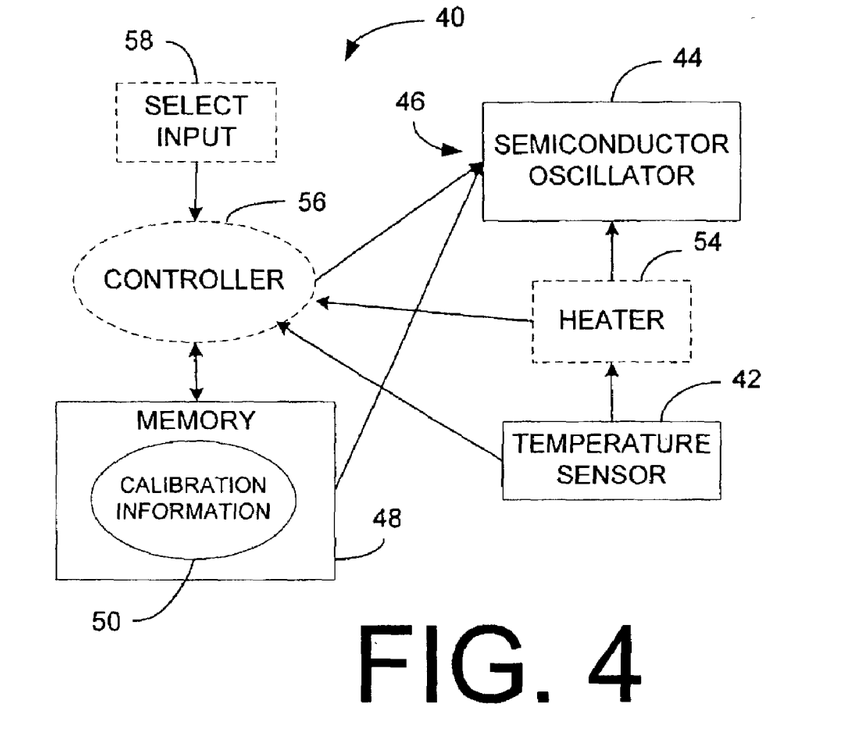
FIG. 4 is a block diagram showing an aspect of a crystal oscillator emulator.

FIG. 4 shows another aspect of a crystal oscillator emulator 40. The crystal oscillator emulator 40 is similar to crystal oscillator 10 in function with similar corresponding elements numbered in the range of 40–52, except that crystal oscillator emulator 40 may also include one or more of a heater 54, a controller 56, and a select input 58 alone or in combination.

The heater 54 may be located on the semiconductor die in the vicinity of the semiconductor oscillator 44 to provide a source of local heating. Any type of heater 54 may be used including transistor heaters and resistive heaters. The heater 54 may be operated in response to an input from the temperature sensor 52 to control the temperature of the semiconductor die. The heater 54 may increase the semiconductor die temperature to a level that corresponds to one of the temperature levels for which correction factors have been determined. In addition, a package having a high thermal impedance may enclose the crystal oscillator emulator 40.

In one case, the heater 54 may increase the semiconductor die temperature to the maximum operating temperature. Here, during device or batch level testing only the correction factor corresponding to the maximum operating temperature would have to be determined, leading to reduced costs.

The heater 54 may also be controlled to raise the semiconductor die temperature to one of several predetermined temperature levels for which correction factors have been determined. A second temperature sensor may sense an external temperature such as an ambient temperature or an assembly temperature. The heater 54 then may increase the semiconductor die temperature to the nearest of the predetermined temperature levels while continuously changing the control input during the temperature transition using extrapolated values computed from the correction factors.

The controller 56 may add extra functionality by for example controlling the heater 54 in response to multiple temperature sensors or manipulating the calibration information 50 to derive values for the control input that correspond to intermediate temperatures. The controller 56 may be any type of entity including a processor, logic circuitry, and a software module.

The select input 58 may be used for selecting specific output frequencies from within a range of output frequencies. The output frequency may be selected as a function of the impedance of an external component connected to the select input. The external component may be used directly as a portion of the semiconductor oscillator to select the output frequency, or indirectly such as selecting values of impedance within a predetermined range may correspond to predetermined output frequencies. The external component may be any component, but is preferably a passive component such as a resistor or capacitor.

Figure 5:
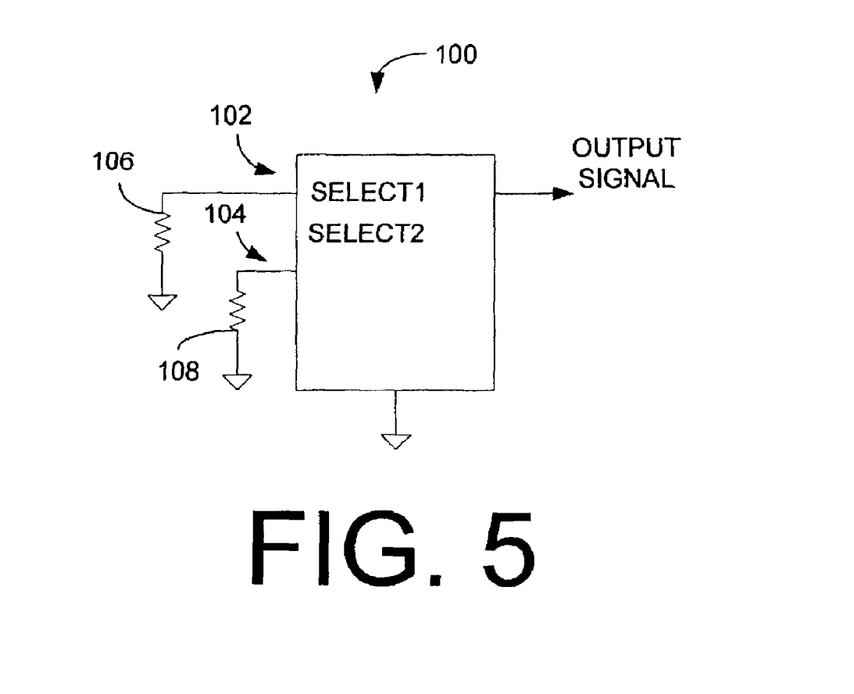
FIG. 5 is a two-dimensional view of an aspect of a crystal oscillator emulator connected to external impedances.

FIG. 5 shows an aspect of a crystal oscillator emulator 100 having, for example, two select pins 102 and 104 to connect to two external impedances 106 and 108. One or more pins may be used to interface to the external component(s). The crystal oscillator emulator 100 probes or derives information from the external components connected to the select pins 102 and 104. The derived information may have three or more predetermined level ranges that correspond to selected levels of the emulator characteristics. For example, a single pin connected to an external resistor may be used to select any one of 16 output frequency levels. The resistance of the external resistor is preferably selected to be one of 16 predetermined standard values. Each of the 16 values of resistance corresponds to one of the 16 output frequency levels. In addition, low precision passive components are preferably used as the external components to reduce cost and inventory. Each external component may have multiple, N, predetermined nominal values that each correspond to the selection of a predetermined characteristic level. If one pin is used, then N different characteristic levels may be selected. If two pins are used, then N*N different characteristic levels may be selected, and so forth for an increasing number of selection pins. The types of device characteristics that for example may be selected include output frequency, frequency tolerance, and baseline correction factor. For example, the crystal oscillator emulator 100 may have a single select pin 102 connected to an external resistor that may have a nominal value selected from a group of 16 predetermined values. Each of the 16 predetermined values has a measured value range which corresponds to one of 16 predetermined output frequency levels possibly ranging from 1 MHz to 100 MHz.

The external impedances 106 and 108 are preferably resistors, capacitors, or combinations of resistors and capacitors, but may be any component that exhibits predominantly an inductance, resistance, capacitance, or combination thereof. The external impedances 106 and 108 may be connected directly or indirectly from any energy source such as Vdd and ground or any suitable reference to the pins 102 and 104. For example, the external impedance 106 may be connected through a resistor/transistor network to Vdd and through a capacitor network to the select pin 102.

The crystal oscillator emulator 100 may determine a predetermined select value corresponding to the measured value of the impedance connected to a select pin. Preferably, the impedance is selected to have a standard value such as nominal resistance values corresponding to resistors having a 10% tolerance (e.g. 470, 560, 680, . . . ) to reduce device and inventory costs. To account for measurement tolerances and the tolerance of the external impedance, a range of impedance values may correspond to a single select value. The select value is preferably a digital value, but may also be an analog value. For example, values of measured resistance from 2400 ohms to 3000 ohms may be associated with a digital value corresponding to 2. While values of measured resistance from 3001 ohms to 4700 ohms are associated with a digital value corresponding to 3. The measured resistance includes variations due to tolerances of the external impedance and the internal measurement circuit. The impedance measured at each select pin is used to determine a corresponding digital value. The range of digital values may include 3 or more digital values and preferably range from 10 to 16 digital values per select pin. The digital values corresponding to each select pin may be used in combination to describe memory addresses. For example, a device having three select pins each to interface to impedance values that are mapped into one of 10 digital values, may describe 1000 memory addresses or lookup table values. The contents of the storage locations corresponding to the memory addresses are used to set a value for an output or internal characteristic of the device. Another exemplary device may include two select pins, each configured to interface to external impedances that are mapped to a digital value within a range of 10 values. The digital values in combination may describe 100 memory addresses or lookup table values that may each contain data for setting a characteristic of the crystal oscillator emulator 100.

Figure 6:
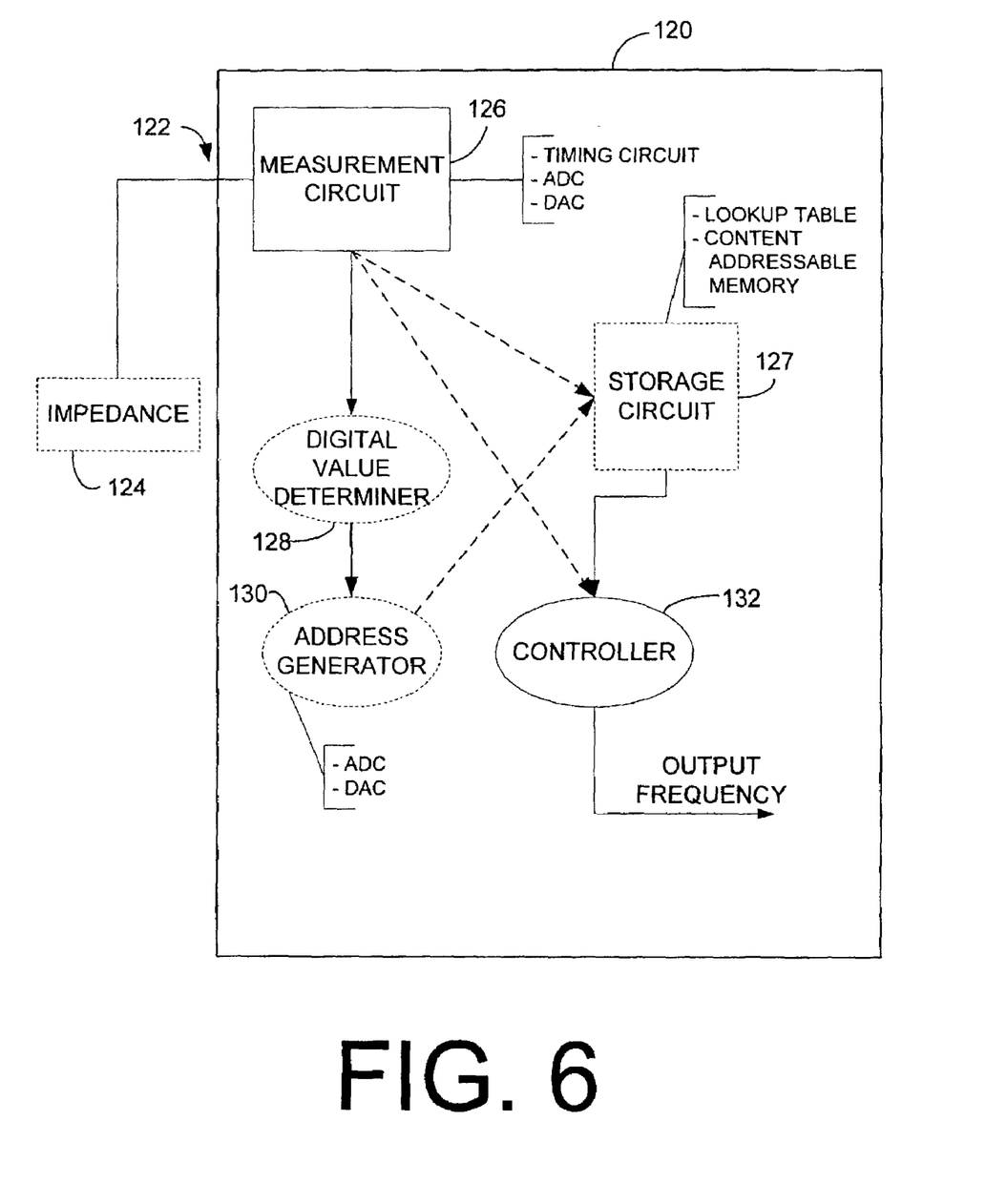
FIG. 6 is a detailed block diagram of an aspect of a crystal oscillator emulator connected to an external impedance.

FIG. 6 shows a block diagram of an aspect of a crystal oscillator emulator 120. The crystal oscillator emulator 120 includes a select pin 122 to interface to an external impedance 124 that is used for selecting a configuration of the crystal oscillator emulator 120. The external impedance 124 is similar in function and scope to the external impedances 116 and 118.

A measurement circuit 126 connected to the select pin 122 measures an electrical characteristic that is a function of the external impedance 124. For example, a current may be supplied to the external impedance and the voltage that is developed across the external impedance 124 then measured. Also, a voltage may be impressed across the external impedance 124 and then measure the current. Any measurement technique for measuring passive components may be used to measure the electrical characteristic including dynamic as well as static techniques. Exemplary measurement techniques include timing circuits, analog to digital converters (ADCs), and digital to analog converters (DACs).

Preferably, the measurement circuit has a high dynamic range. The measurement circuit 126 may generate an output having a value corresponding to the value of the external impedance 124. The output may be either digital or analog. The same output value preferably represents a range of external impedance values to compensate for value variations such as tolerances in the external impedance value, interconnect losses, and measurement circuit tolerances due to factors including process, temperature, and power. For example, all measured external impedance values ranging from greater than 22 up to 32 ohms may correlate to a digital output value of "0100". While measured external impedance values ranging from greater than 32 up to 54 ohms may correlate to a digital output value of "0101". The actual external impedance values are a subset of the measured external impedance value to account for the value variations. For example, in the above cases the actual external impedance values might be from 24 to 30 ohms and from 36 to 50 ohms. In each case an inexpensive low precision resistor may be selected to have a value centered within the range, such as 27 ohms and 43 ohms. In this way, inexpensive low precision components may be used to select amongst a range of high precision outputs. The select value may be used directly as a variable value to control a device characteristic of the crystal oscillator emulator 120. The variable value may also be determined indirectly from the select value.

A storage circuit 127 may include variable values that may be selected as a function of the select value. The storage circuit 127 may be any type of storage structure including content addressable memory, static and dynamic memory, and look-up tables.

For the case that the measurement circuit 126 generates output values that have a one-to-one correspondence to the external impedance values, a digital value determiner 128 may then set the output value to a select value that corresponds to a range of external impedance values.

Figure 7A:
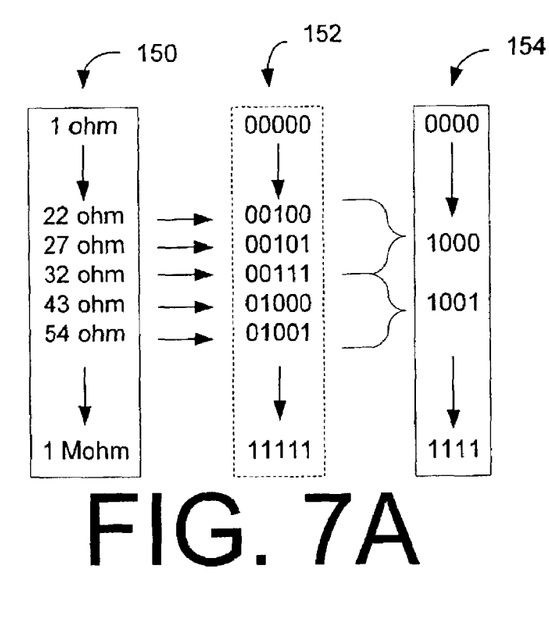
FIGS. 7A and 7B are diagrams showing relationships between an external impedance value and a digital value.

FIG. 7A shows a relationship between groups of impedance values 150 and associated select values 154. The groups of impedance values 150 may have a one-to-one correspondence to groups of digital output values 152 which are converted to the select values 154 associated with each of the groups of impedance values 150. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. The spacing between the groups of impedance values is preferably based on geometric progression, however any mathematical relationship may be used to establish spacing between the groups such as logarithmic, linear, and exponential. The spacing between impedance groups may be based on any impedance value of the groups including a nominal value, an average value, a mean value, a starting value, and an ending value. Factors that influence selection of the impedance range of the groups and the spacing may include various tolerances such as the tolerance of the external impedance, the tolerance of internal voltage and current sources, and the tolerance of the measurement circuit. The tolerances may for example be caused by process, temperature, and power variations.

Figure 7B:
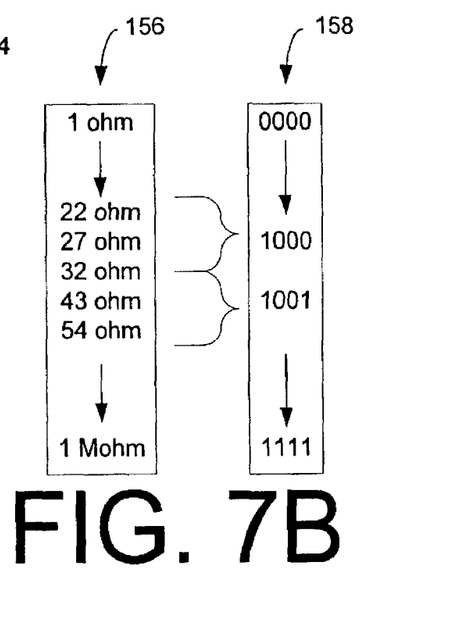

FIG. 7B shows a relationship between ranges of impedance values 156 and associated select values 158. The ranges of impedance values 156 have a direct correspondence to the select values 158. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. This direct correspondence between the ranges of impedance values 156 and associated select values 158 may be implemented by, for example, a nonlinear analog to digital converter (not shown).

Referring back to FIG. 6, an address generator 130 may determine memory locations corresponding to the digital output values associated with external impedances connected to the select pins. The memory locations may be grouped in any manner such as a list for a single select pin, a lookup table for two select pins, and a third order table for three select pins.

A controller 132 may set a device characteristic of the crystal oscillator emulator 120 as a function of the variable value. The variable value may be generated directly by the measurement circuit, determined indirectly from the select value, and determined from the contents of a memory location corresponding to the external impedance values connected to the select pins.

The select pin 124 may also be used for implementing an additional function such as power down (PD), power enable, mode selection, reset, and synchronous operation. In this aspect, the select pin 124 becomes a multi-purpose select pin 124 for configuring the crystal oscillator emulator 120 as well as implementing the additional function.

In one aspect, a first range of impedance values connected to the multi-purpose select pin 124 may be used to configure the crystal oscillator emulator 120, while operation of the additional function may be controlled by a voltage or current impressed on the multi-purpose select pin 124, or impedance values outside the first range of impedance values.

Figure 8:
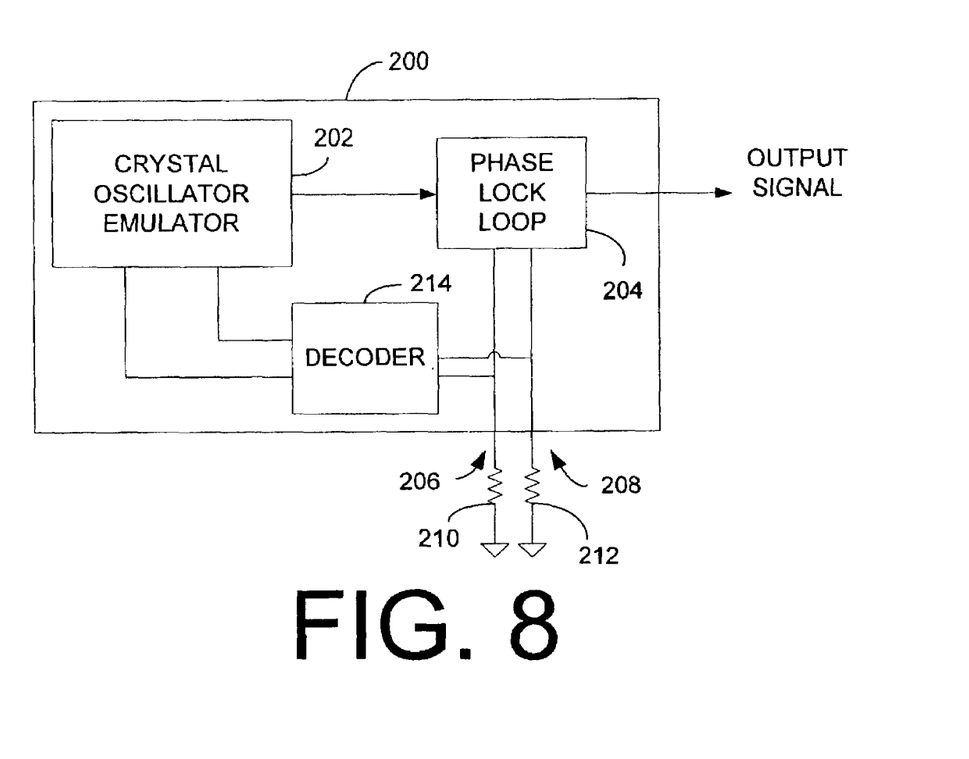
FIG. 8 is a block diagram of an aspect of an oscillator assembly for generating an output having a periodic waveform.

FIG. 8 shows an aspect of an oscillator assembly 200 to generate an output having a periodic waveform. The oscillator assembly 200 includes a crystal oscillator emulator 202 to drive a phase lock loop (PLL) 204. The crystal oscillator emulator 202 may be similar in function and structure to the aspects of the crystal oscillator emulators described above. The oscillator assembly 200 may include any type of PLL 204 such as digital PLLs and analog PLLs.

Multi-purpose select pins 206 and 208 may be used for selection of the operating parameters for the PLL 204 such as the divider factor. The multi-purpose select pins 206 and 208 may also be used for control and operation of the crystal oscillator emulator 202 such as output frequency selection and reception of a reference clock for calibration. External resistors 210 and 212 may be connected to the multi-purpose select pins 206 and 208 to select the operating frequency. The ranges of values of the external resistors 210 and 212 correspond to the selection of different operating frequencies. Each external resistor 210 and 212 may be used to select one of 16 predetermined operating frequencies. In combination, the external resistors 210 and 212 may select from amongst 256 operating frequencies. To control multiple functions, each of the multi-purpose select pins 206 and 208 may receive signals within different voltage ranges. For example, one multi-purpose select pin 206 may connect to an external resistor 210 across which a voltage in the range of 0 to 2 volts may be developed to determine the resistance, and the multi-purpose select pin 206 may also receive a reference clock signal operating in a range of 2 to 3 volts. A decoder 214 may detect signals on the multi-purpose select pins 206 and 208.

Figures 9, 11:
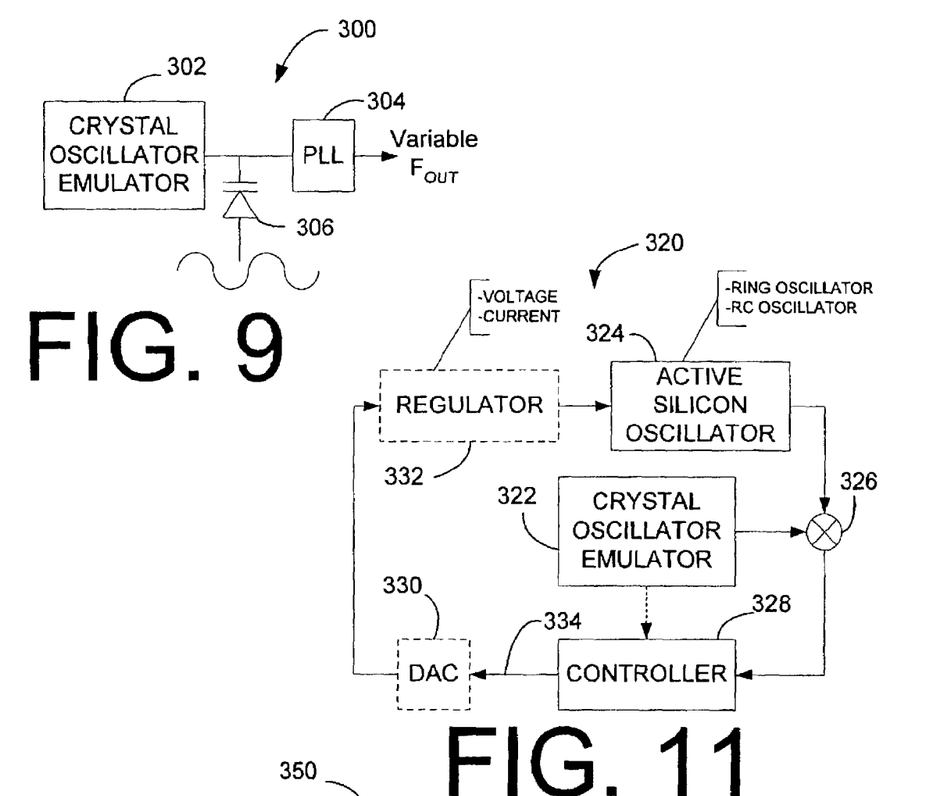
FIG. 9 is a block diagram of an aspect of a spread spectrum generator.
FIG. 11 is a block diagram of an aspect of a low power oscillator.

FIG. 9 shows a spread spectrum oscillator 300 for generating an output signal having a variable frequency. The spread spectrum oscillator 300 includes a crystal oscillator emulator 302 connected to a PLL 304. A frequency control device connected to the crystal oscillator emulator 302 may dynamically control the output frequency of the crystal oscillator emulator 302. The frequency control device may be any device or technique including a varactor, controlling the bias current source of the semiconductor oscillator, and controlling the control input voltage applied to the resonant capacitors of the semiconductor oscillator.

Figure 10:
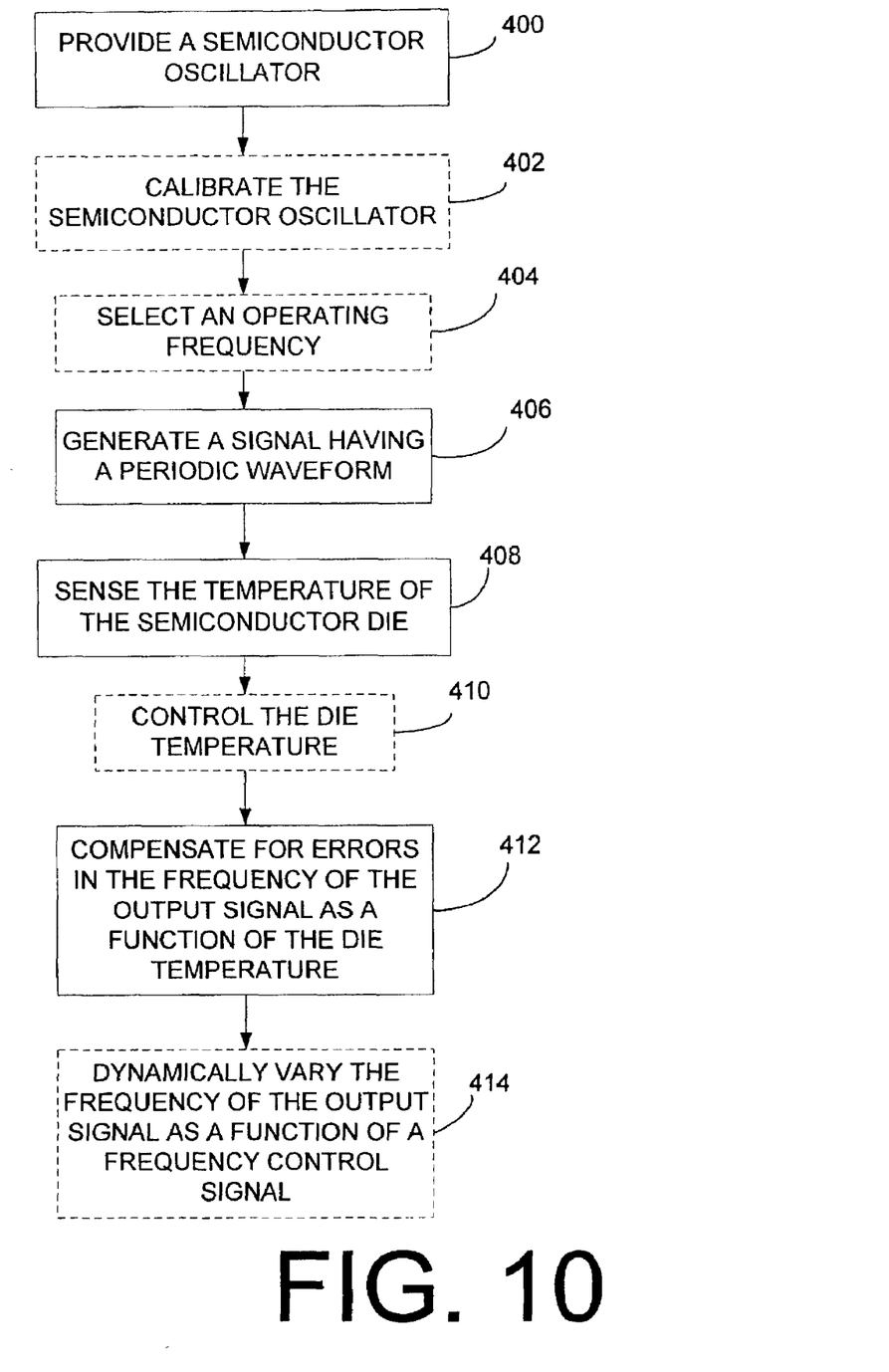
FIG. 10 is a flow diagram of an operation for emulating a crystal oscillator.

FIG. 10 shows the operation of an aspect of a crystal oscillator emulator. At block 400, a semiconductor oscillator is provided for generating an output signal having a periodic waveform. Continuing to block 402, the semiconductor oscillator may be calibrated to generate a constant frequency over a predetermined range of temperature. In one aspect, the calibration may include varying the temperature of the semiconductor die over a predetermined temperature range and measuring calibration information for maintaining a constant output frequency. The die temperature may be measured in the vicinity of the semiconductor oscillator. The calibration information may include control input values versus die temperatures for maintaining a constant output frequency. The calibration information may be stored in non-volatile memory on the semiconductor die. At block 404, an operating frequency may be determined by probing an external component. Continuing to block 406, the semiconductor oscillator generates an output signal having an operating frequency. At block 408, the temperature of the semiconductor die is determined in the vicinity of the semiconductor oscillator. Continuing to block 410, the semiconductor die may be heated or cooled to control the die temperature to one or more predetermined temperature levels. At block 412, the control input may be controlled as a function of the die temperature to compensate for changes in the operating frequency of the output signal caused by temperature changes. The stored calibration information may be used to control the control input. The calibration information may be used directly for die temperatures that correspond to stored temperatures. For other die temperatures, the control input value may be extrapolated from the stored calibration information. Continuing to block 414, the frequency of the output signal may be dynamically varied as a function of a frequency control signal.

FIG. 11 shows an aspect of a low power oscillator 320 for generating a periodic signal. The low power oscillator 320 includes a crystal oscillator emulator 322 to calibrate an active silicon oscillator 324. The crystal oscillator emulator 322 is normally in the off state to reduce power consumption. At predetermined intervals, the crystal oscillator emulator 322 is switched to the powered on state to calibrate the active silicon oscillator 324. The active silicon oscillator 324 consumes less power than the crystal oscillator emulator 322, so operating the active silicon oscillator 324 continuously while only operating the crystal oscillator emulator 322 intermittently reduces the overall power consumption of the low power oscillator 320. Any type of active silicon oscillator may be used including ring oscillators and RC oscillators. The crystal oscillator emulator 324 may be configured in accordance with any of the aspects of the invention as described and shown in this specification.

A summer 326 may determine the frequency error between the active silicon oscillator output and the crystal oscillator emulator output. A controller 328 may generate a control signal, based on the frequency error, to control the frequency of the active silicon oscillator 324. The controller 328 may also receive temperature information from the crystal oscillator emulator 322. The temperature information may include temperatures such as the temperature of the semiconductor and the ambient temperature. The controller 328 may include calibration information for the active silicon oscillator 324 similar to the calibration information for the crystal oscillator emulator 322. The frequency error may be used to set an initial value for the control signal and then the temperature information in combination with the active silicon oscillator calibration information may be used to update the control signal while the crystal oscillator emulator 322 is powered down. In one aspect, the temperature sensing circuit of the crystal oscillator emulator 322 may remain continuously powered so that continuous temperature information may be supplied to the controller 328. The control signal 334 may be either digital or analog. If the control signal is digital, a digital-to-analog converter (DAC) 330 may convert the control signal to analog.

A regulator 332 may, in response to the control signal 334 control the supply of power for the active silicon oscillator 324 to adjust the operating frequency. The supply of voltage and/or current to the active silicon oscillator 324 may be controlled. For example, the regulator 332 may control the voltage level of the supply voltage.

In operation, the active silicon oscillator 324 is normally in the on state generating a periodic output signal. The crystal oscillator emulator 322 is normally in the off state. In the off state, either all or a portion of the crystal oscillator emulator 322 may be powered off to conserve power. At a predetermined time, power is applied to the crystal oscillator emulator 322. The semiconductor oscillator of the crystal oscillator emulator 322 is then calibrated with the stored calibration information. The frequency of the output signal of the crystal oscillator emulator 322 is compared with the frequency of the output signal of the active silicon oscillator 324 to determine the frequency error of the active silicon oscillator 324. The control signal 334 changes in response to the frequency error, causing a shift in the supply voltage from the voltage regulator 332, leading to a change in the output frequency of the active silicon oscillator 324, reducing the frequency error.

Figure 12:
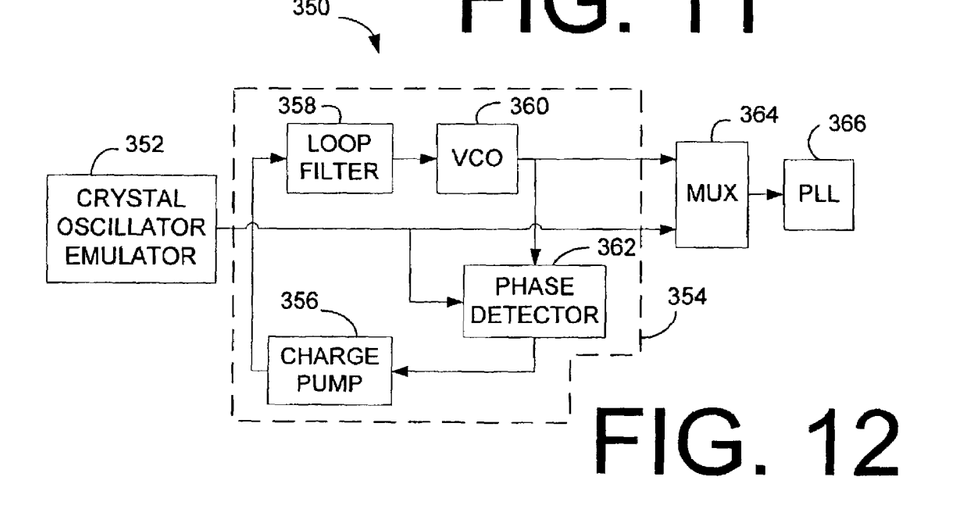
FIG. 12 is a block diagram of another aspect of a low power oscillator.

FIG. 12 shows an aspect of another low power oscillator 350 for generating a periodic signal. The low power oscillator 350 includes a crystal oscillator emulator 352 in communication with a charge pump oscillator 354. The crystal oscillator emulator 352 is normally in the powered down state to reduce power consumption. During the powered down state, either all or a portion of the crystal oscillator emulator 352 may be powered down. At predetermined intervals, the crystal oscillator emulator 352 may be powered up and used to calibrate the charge pump oscillator 354. The predetermined intervals may be determined as a function of any circuit parameter such as operating time, temperature change of the semiconductor, ambient temperature change, temperature of the semiconductor, and supply voltage change.

The charge pump oscillator 354 may include a charge pump 356, loop filter 358, voltage controlled oscillator (VCO) 360, and phase detector 362. The charge pump oscillator 354 is similar in operation to conventional charge pump oscillators, except that the reference input of the phase detector 362 receives a reference clock signal from the crystal oscillator emulator 352.

A multiplexer 364 receives the output signals from the crystal oscillator emulator 352 and the charge pump oscillator 354. One of the output signals is selected and passed through the multiplexer 375 to a phase locked loop 366. The phase locked loop 366 generates an output signal as a function of the output signals from the crystal oscillator emulator 352 and the charge pump oscillator 354.

In operation, the charge pump oscillator 354 is normally in the on state generating a periodic output signal. The crystal oscillator emulator 352 is normally in the off state. In the off state, either all or a portion of the crystal oscillator emulator 352 may be powered off to reduce power consumption. At a predetermined time, power is applied to the crystal oscillator emulator 352. The semiconductor oscillator of the crystal oscillator emulator 352 is then calibrated with the stored calibration information. The output signal of the crystal oscillator emulator 352 is compared with the output signal of the charge pump oscillator 354 to determine the phase error of the charge pump oscillator 324. The VCO 360 is then controlled to reduce the phase error so that the output signal of the charge pump oscillator 354 is calibrated to the output signal of the crystal oscillator emulator 352. One of the output signals may then be selected and applied to the PLL 366.

A number of embodiments of the invention have been described. Nevertheless, it will be understood that various modifications may be made without departing from the spirit and scope of the invention. Accordingly, other embodiments are within the scope of the following claims.

What is claimed is:

1. A device for generating an output signal having a frequency, the device having a die temperature, comprising:
a first temperature sensor to sense a first temperature;
a non-volatile memory to store calibration information for controlling the output signal frequency as a function of the first temperature;
a semiconductor oscillator to generate the output signal as a function of the calibration information; and
a select input to select the output signal frequency as a function of an external passive component.

2. The device of claim 1 wherein the first temperature represents a change in temperature from an initial temperature to a second temperature.

3. The device of claim 1 wherein the first temperature is the die temperature near the semiconductor oscillator.

4. The device of claim 1 further comprising a heater to control the die temperature to a predetermined operating temperature.

5. The device of claim 4 wherein the heater operates in response to the first temperature sensor.

6. The device of claim 4 wherein the heater is selected from a group consisting of transistor heaters and resistive heaters.

7. The device of claim 3 further comprising an insulated package to contain the device.

8. The device of claim 1 further comprising a calibration circuit to generate the calibration information.

9. The device of claim 1 wherein the device is formed on a semiconductor die.

10. The device of claim 1 further comprising a phase lock loop (PLL) to receive the output signal and to generate a phase locked signal.

11. The device of claim 10 further comprising a frequency control device to dynamically vary the output signal frequency.

12. A device for generating an output signal having a frequency, the device having a die temperature, comprising:

a first temperature sensor to sense a first temperature;
a non-volatile memory to store calibration information for controlling the output signal frequency as a function of the first temperature;
a semiconductor oscillator to generate the output signal as a function of the calibration information;
a second temperature sensor to sense an external temperature;
a heater to control the die temperature; and
a controller, in response to the first and second temperature sensors, to control the heater.

13. A device having an output frequency and a die temperature, comprising:
    on a semiconductor die;
    a) a first temperature sensor to sense the die temperature and generate a temperature signal;
    b) a heater, in response to the temperature signal, to maintain the die temperature at a predetermined operating temperature;
    c) a non-volatile memory to store calibration information relating the predetermined operating temperature to the output frequency; and
    d) a semiconductor oscillator to generate the output frequency as a function of the calibration information;
    e) a select input to select the output frequency as a function of an external passive component.

14. The device of claim 13 wherein the die temperature represents a change in temperature from an initial temperature to a second temperature.

15. The device of claim 13 wherein the heater is selected from a group consisting of transistor heaters and resistive heaters.

16. The device of claim 13 further comprising an insulated package to contain the device.

17. The device of claim 13 further comprising a calibration circuit to generate the calibration information.

18. A method of generating an output signal having a frequency, comprising:
    providing a semiconductor oscillator having a die temperature;
    sensing a first temperature associated with the semiconductor oscillator;
    determining a change in temperature from a calibration temperature to the first temperature;
    determining a frequency correction value based on the change in temperature;
    generating the output signal frequency as a function of the frequency correction value;
    sensing an external temperature; and
    adjusting the die temperature to a temperature level greater than the external temperature and for which calibration information is stored.

19. The method of claim 18 further including storing calibration information for controlling the output frequency as a function of the die temperature.

20. The method of claim 19 wherein the calibration information includes frequency values.

21. The method of claim 20 further comprising generating the calibration information.

22. The method of claim 21 wherein generating the calibration information includes sensing the die temperature; and
    determining the frequency correction value to adjust the output signal frequency to a predetermined frequency.

23. The method of claim 22 wherein generating the calibration information further includes controlling the die temperature.

24. The method of claim 23 wherein controlling the die temperature includes increasing the die temperature; and 25. The method of claim 18 further comprising controlling the die temperature, wherein controlling the die temperature includes heating the semiconductor oscillator.

26. A device for generating an output signal having a frequency, the device having a die temperature, comprising:
    first means for sensing a first temperature;
    means for storing calibration information for controlling the output signal frequency as a function of the first temperature;
    means for generating an oscillatory output signal as a function of the calibration information; and
    means for selecting to select the output signal frequency as a function of an external passive component.

27. The device of claim 26 wherein the first temperature represents a change in temperature from an initial temperature to a second temperature.

28. The device of claim 26 wherein the first temperature is the die temperature near the semiconductor oscillator.

29. The device of claim 26 further comprising means for heating to control the die temperature to a predetermined operating temperature.

30. The device of claim 29 wherein the heating means operates in response to the first means.

31. The device of claim 29 wherein the heating means is selected from a group consisting of transistor heaters and resistive heaters.

32. The device of claim 28 further comprising insulating means to thermally isolate the device.

33. The device of claim 26 further comprising means for calibrating to generate the calibration information.

34. The device of claim 26 wherein the device is formed on a semiconductor die.

35. The device of claim 26 further comprising means for phase locking to receive the output signal and to generate a phase locked signal.

36. The device of claim 35 further comprising means for frequency controlling to dynamically vary the output signal frequency.

37. A device for generating an output signal having a frequency, the device having a die temperature, comprising:
    a first temperature sensor to sense a first temperature;
    a non-volatile memory to store calibration information for controlling the output signal frequency as a function of the first temperature;
    a semiconductor oscillator to generate the output signal as a function of the calibration information;
    an active silicon oscillator to generate an output signal having a frequency;
    a summer to determine a frequency error between the output signal of the semiconductor oscillator and the output signal of the active silicon oscillator; and
    a controller to control the output signal of the active silicon oscillator as a function of the frequency error.

38. The device of claim 37 wherein the active silicon oscillator is a ring oscillator having a supply voltage; and
    further comprising a regulator, responsive to the controller, to control the supply voltage so that the frequency error is reduced.

39. A device for generating an output signal having a frequency, the device having a die temperature, comprising:
    a first temperature sensor to sense a first temperature;

a non-volatile memory to store calibration information for controlling the output signal frequency as a function of the first temperature;
a semiconductor oscillator to generate the output signal as a function of the calibration information;
a charge pump oscillator to generate an output signal having a frequency; and
the semiconductor oscillator in communication with the charge pump oscillator to calibrate the output signal of the charge pump oscillator.

40. The device of claim 39 wherein the charge pump oscillator further includes;
a phase detector to determine a phase error between the output signal of the charge pump oscillator and the output signal of the semiconductor oscillator; and
a voltage controlled oscillator in communication with the phase detector, to generate the output signal of the charge pump oscillator.

41. The device of claim 40 further comprising:
a multiplexer to select one of the output signal of the charge pump oscillator and the output signal of the semiconductor oscillator; and
a phase lock loop in communication with the multiplexer, to generate an output signal.

42. A method of generating an output signal having a frequency, comprising:
providing a semiconductor oscillator having a die temperature;
sensing a first temperature associated with the semiconductor oscillator;
determining a change in temperature from a calibration temperature to the first temperature;
determining a frequency correction value based on the change in temperature;
generating the output signal frequency as a function of the frequency correction value;
generating a periodic signal having a frequency;
calibrating the periodic signal with the output signal; and
intermittently powering down the semiconductor oscillator.

43. The method of claim 42 wherein calibrating includes;
determining a frequency error between the output signal and the periodic signal; and
controlling the frequency of the periodic signal to reduce the frequency error.

44. The method of claim 43 further comprising providing an active silicon oscillator having a supply voltage, to generate the periodic signal; and
controlling an electrical characteristic of the supply voltage so that the frequency error is reduced.

45. The method of claim 42 further comprising providing a charge pump oscillator to generate the periodic signal.

46. The method of claim 45 further comprising determining a phase error between the periodic signal and the output signal.

47. The method of claim 46 further comprising selecting one of the output signal and the periodic signal; and
generating a phase locked signal as a function of the selected one of the output signal and the periodic signal.

48. A device for generating an output signal having a frequency, the device having a die temperature, comprising:
first means for sensing a first temperature;
means for storing calibration information for controlling the output signal frequency as a function of the first temperature;
means for generating an oscillatory output signal as a function of the calibration information;
means for generating a periodic signal having a frequency;
means for summing to determine a frequency error between the output signal and the periodic signal; and
means for controlling to control the periodic signal as a function of the frequency error.

49. The device of claim 48 wherein the means for generating a periodic signal is a ring oscillator having a supply voltage; and
further comprising means for regulating, responsive to the controlling means, to control an electrical characteristic of the supply voltage so that the frequency error is reduced.

50. A device for generating an output signal having a frequency, the device having a die temperature, comprising:
first means for sensing a first temperature;
means for storing calibration information for controlling the output signal frequency as a function of the first temperature;
means for generating an oscillatory output signal as a function of the calibration information; and
means for generating a periodic signal having a frequency,
wherein the means for generating the oscillatory output signal in communication with the means for generating the periodic signal, to calibrate the output signal.

51. The device of claim 50 wherein the means for generating the periodic signal further includes;
means for determining a phase error between the output signal and the periodic signal; and
means for oscillating in communication with the means for determining the phase error, to generate the periodic signal.

52. The device of claim 51 further comprising means for selecting one of the output signal and the periodic signal; and
a phase lock loop in communication with the means for selecting, to generate an output signal.

53. The device of claim 37 wherein the controller further controls the output signal of the active semiconductor oscillator as a function of the first temperature.

54. The device of claim 38 wherein the regulator controls an electrical characteristic of the supply voltage selected from the group consisting of voltage and current.

55. The method of claim 42 further comprising providing calibration information for the periodic signal; and
when the semiconductor oscillator is powered down, controlling the periodic signal as a function of the first temperature and the periodic signal calibration information.

56. The method of claim 44 wherein the electrical characteristic of the supply voltage is selected from the group consisting of voltage and current.

57. The device of claim 48 wherein the controlling means further controls the means for generating the periodic signal as a function of the first temperature.

58. The device of claim 49 wherein the electrical characteristic of the supply voltage is selected from the group consisting of voltage and current.

59. A device for generating an output signal having a frequency, the device having a die temperature, comprising:
a first temperature sensor to sense a first temperature;
a non-volatile memory to store calibration information for controlling the output signal frequency as a function of the first temperature;

a semiconductor oscillator to generate the output signal as a function of the calibration information and independent from a crystal oscillator reference frequency; and a select input to select the output signal frequency as a function of an external passive component.

60. A device having an output frequency and a die temperature, comprising:
on a semiconductor die;
 a) a first temperature sensor to sense the die temperature and generate a temperature signal;
 b) a heater, in response to the temperature signal, to maintain the die temperature at a predetermined operating temperature;
 c) a non-volatile memory to store calibration information relating the predetermined operating temperature to the output frequency;
 d) a semiconductor oscillator to generate the output frequency as a function of the calibration information and independent from a crystal oscillator reference frequency; and
 e) a select input to select the output signal frequency as a function of an external passive component.

61. A method of generating an output signal having a frequency, comprising:
 providing a semiconductor oscillator having a die temperature;
 sensing a first temperature associated with the semiconductor oscillator;
 determining a change in temperature from a calibration temperature to the first temperature;
 determining a frequency correction value based on the change in temperature;
 generating the output signal frequency as a function of the frequency correction value independently from a crystal oscillator reference frequency; and
 selecting the output signal frequency as a function of an external passive component.

62. A device for generating an output signal having a frequency, the device having a die temperature, comprising:
 first means for sensing a first temperature;
 means for storing calibration information for controlling the output signal frequency as a function of the first temperature;
 semiconductor oscillating means for generating an oscillatory output signal as a function of the calibration information and independently from a crystal oscillator reference frequency; and
 selecting means for selecting the output signal frequency as a function of an external passive component.

63. A device for generating an output signal having a frequency, the device having a die temperature, comprising:
 a first temperature sensor to sense a first temperature;
 a non-volatile memory to store calibration information for controlling the output signal frequency as a function of the first temperature;
 a semiconductor oscillator to generate the output signal as a function of the calibration information wherein the calibration information includes plural pre-stored correction values; and
 a select input to select the output signal frequency as a function of an external passive component.

64. A device having an output frequency and a die temperature, comprising:
on a semiconductor die;
 a) a first temperature sensor to sense the die temperature and generate a temperature signal;
 b) a heater, in response to the temperature signal, to maintain the die temperature at a predetermined operating temperature;
 c) a non-volatile memory to store calibration information relating the predetermined operating temperature to the output frequency; and
 d) a semiconductor oscillator to generate the output frequency as a function of the calibration information wherein the calibration information includes plural pre-stored correction values; and
 e) a select input to select the output signal frequency as a function of an external passive component.

65. A method of generating an output signal having a frequency, comprising:
 providing a semiconductor oscillator having a die temperature;
 sensing a first temperature associated with the semiconductor oscillator;
 determining a change in temperature from a calibration temperature to the first temperature;
 determining a frequency correction value based on the change in temperature;
 generating the output signal frequency as a function of the frequency correction value wherein the calibration information includes plural pre-stored correction values; and
 selecting the output signal frequency as a function of an external Passive component.

66. A device for generating an output signal having a frequency, the device having a die temperature, comprising:
 first means for sensing a first temperature;
 means for storing calibration information for controlling the output signal frequency as a function of the first temperature;
 semiconductor oscillating means for generating an oscillatory output signal as a function of the calibration information wherein the calibration information includes plural pre-stored correction values; and
 selecting means for selecting the output signal frequency as a function of an external passive component.

* * * * *

UNITED STATES PATENT AND TRADEMARK OFFICE
CERTIFICATE OF CORRECTION

PATENT NO. : 7,042,301 B2  Page 1 of 1
APPLICATION NO. : 10/272247
DATED : May 9, 2006
INVENTOR(S) : Sehat Sutardja It is certified that error appears in the above-identified patent and that said Letters Patent is hereby corrected as shown below:

| | |
|---|---|
| Column 6, Line 44 | Delete "in" after "separated" |
| Column 7, Line 2 | Delete "in" |
| Column 16, Line 41 | Delete "Passive" and insert --passive-- |
| Column 11, Line 60 | Insert --correction-- after "frequency" |
| Column 12, Line 5 | After "and" at the end of the first paragraph, insert the following second paragraph: --at predetermined temperature levels of the die temperature, determining the frequency correction value to maintain the output signal frequency at a constant frequency.-- |

Signed and Sealed this

Sixth Day of March, 2007

JON W. DUDAS
*Director of the United States Patent and Trademark Office*